(12) United States Patent
Nuetzel et al.

(10) Patent No.: US 7,341,875 B2
(45) Date of Patent: Mar. 11, 2008

(54) SEMICONDUCTOR MEMORY DEVICE WITH A CAPACITOR FORMED THEREIN AND A METHOD FOR FORMING THE SAME

(75) Inventors: Joachim Nuetzel, Dresden (DE); Till Schloesser, Dresden (DE); Siegfried Schwarzl, Neubiberg (DE); Stefan Wurn, Austin, TX (US)

(73) Assignee: Infineon Technologies AG, Munich (DE)

( * ) Notice: Subject to any disclaimer, the term of this patent is extended or adjusted under 35 U.S.C. 154(b) by 261 days.

(21) Appl. No.: 10/478,642

(22) PCT Filed: May 21, 2002

(86) PCT No.: PCT/DE02/01818

§ 371 (c)(1),
(2), (4) Date: Jun. 14, 2005

(87) PCT Pub. No.: WO02/095794

PCT Pub. Date: Nov. 28, 2002

(65) Prior Publication Data

US 2007/0082413 A1    Apr. 12, 2007

(30) Foreign Application Priority Data

May 25, 2001    (DE) .................. 101 25 594

(51) Int. Cl.
H01L 21/00    (2006.01)
(52) U.S. Cl. .................. 438/3; 438/239; 257/295; 257/E21.665

(58) Field of Classification Search .................. 438/3, 438/239, 250, 253; 257/295, 297, 298, 299, 257/300, 306
See application file for complete search history.

(56) References Cited

U.S. PATENT DOCUMENTS

| 5,900,656 | A | 5/1999 | Park |
| 6,351,408 | B1* | 2/2002 | Schwarzl et al. ........... 365/158 |
| 6,381,171 | B1* | 4/2002 | Inomata et al. ............. 365/173 |
| 7,038,320 | B1* | 5/2006 | You et al. ................... 257/774 |
| 2002/0140060 | A1 | 10/2002 | Asao et al. ................. 257/661 |

FOREIGN PATENT DOCUMENTS

WO    WO 00/52701    9/2000

OTHER PUBLICATIONS

Patent Abstracts of Japan vol. 2000, No. 21, Aug. 3, 2001-& JP 2001 101859 A (Toshiba Corp), Apr. 13, 2001 ABSTRACT figures 4,6,8.
International Search Report.
Written Opinion.

* cited by examiner

*Primary Examiner*—Michael Lebentritt
*Assistant Examiner*—Reema Patel
(74) *Attorney, Agent, or Firm*—Slater & Matsil, L.L.P.

(57) ABSTRACT

To integrate a capacitor device (40) into the region of a semiconductor memory device with a particularly small number of process steps, a lower electrode device (43) and an upper electrode device (44) of the capacitor device (40) are provided to be formed directly underneath or directly above the material region (30) which has the memory elements (20), in such a way that as a result at least a part of the material region (30) which has the memory elements (20) functions at least as part of the respective dielectric (45) between the electrodes devices (43, 44).

20 Claims, 2 Drawing Sheets

SEMICONDUCTOR MEMORY DEVICE WITH A CAPACITOR FORMED THEREIN AND A METHOD FOR FORMING THE SAME

BACKGROUND

1. Field of the Invention

The invention relates to a semiconductor memory device, such as an MRAM memory device, and a method for forming a capacitor in semiconductor memory.

2. Background Information

An objective of developing modern semiconductor memory technology is to form the most extensive integration density possible. At the same time, high functional reliability of the memory elements produced and comparatively simple process sequences in the fabrication method are important considerations.

In designing semiconductor memory devices, in addition to the actual memory cells or memory elements themselves, additional components of either a passive or an active type also may have to be incorporated into the semiconductor chip. When capacitor elements or integrated capacitors are to be included into the chip, known manufacturing methods and known memory geometries cannot be implemented without additional process steps and without weakening the geometries.

There exists a need for integrating capacitor devices into a region of a semiconductor memory device with a reduced number of processed steps.

SUMMARY

A method for manufacturing a semiconductor memory device is described. A plurality of memory elements are formed respectively spaced apart from one another laterally in a material region, extending either substantially laterally or as a part thereof. At least one capacitor device is provided, each of which with at least a first electrode device, a second electrode device, and a dielectric that is formed substantially between them. At least one of the first electrode device and the second electrode device is formed substantially underneath or above the material region in which the memory elements are formed. At least during operation of the device, at least a part of the material region in which the memory elements are formed is provided at least as part of the respective dielectric.

A semiconductor memory device is also described. A plurality of memory elements are formed respectively spaced apart from one another laterally in a material region that extends substantially laterally or as a part thereof; and in which at least one capacitor device is provided, each with a first electrode device and a second electrode device and a dielectric that is formed substantially between them, wherein at least one of the first or lower electrode device and the second electrode device is formed essentially directly underneath or directly above the material region that contains the memory elements, and whereby, at least during operation, at least a part of the material region that has the memory elements is provided at least as part of the respective dielectric.

The invention is explained in more detail below with reference to a diagrammatic drawing on the basis of preferred exemplary embodiments of the method according to the invention for fabricating a semiconductor memory device.

BRIEF DESCRIPTION OF THE DRAWINGS

FIG. 1 illustrates a sectional side view of a structure of a first embodiment of the semiconductor memory device 1 in accordance with the invention.

FIG. 2 illustrates that a first or lower access line device 13 is formed in a laterally-widened fashion, such that it simultaneously can perform the function of a first or lower electrode device 43 of the capacitor device 40.

FIG. 3 illustrates, in contrast to the embodiment in FIG. 1, that the second or upper access line device 14 is formed with a greater lateral extent, so that it simultaneously or integrally forms the second or upper electrode device 44 of the electrode device 40.

DETAILED DESCRIPTION

Figure 1:
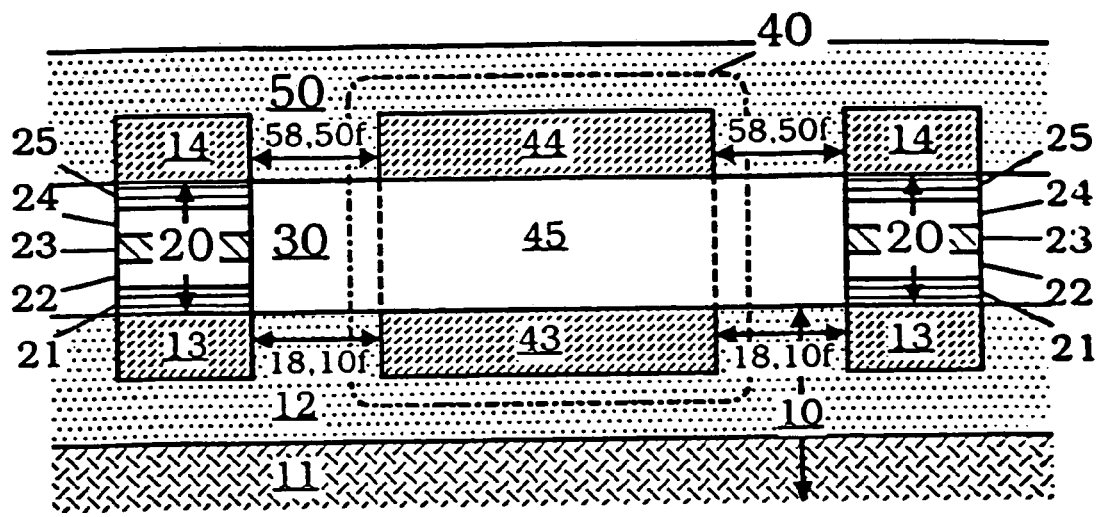
FIGS. 1-3 each illustrate an embodiment of the semiconductor memory device according to the invention in a schematic and sectional side view.

In the following FIGS. 1-3, the same reference symbols always designate the same structures or elements, and the corresponding detailed descriptions are not repeated in any case. A list of reference numerals is provided below:
1 Semiconductor memory device
10 Basic structure
10*f* Spacer element
11 Semiconductor substrate
12 Passivation region
13 First metallization region, first access line device
14 Second metallization region, second access line device
18 Intermediate region
20 Memory element, TMR stack element
21 Lower barrier layer
22 Hard magnetic layer
23 Tunnel barrier layer
24 Soft magnetic layer
25 Upper barrier layer
30 Material region, memory element region
40 Capacitor device
43 First/lower electrode device
44 Second/upper electrode device
45 Dielectric
50 Second passivation region
50*f* Spacer element
58 Intermediate region In manufacturing a semiconductor memory device according to an embodiment of the present invention, in particular an MRAM memory or the like, a plurality of memory elements are formed respectively spaced apart from one another laterally in a material region which extends essentially laterally and/or as a part thereof. Furthermore, in each case at least one capacitor device is provided, with in each case at least a first or lower electrode device and a second or upper electrode device and a dielectric which is essentially formed between them.

The manufacturing method according to the invention is further characterized in that the first or lower electrode device and/or the second or upper electrode device are formed essentially directly underneath or directly above the material region which has the memory elements, and in that as a result—at least during operation—at least a part of the material region which has the memory elements is provided at least as part of the respective dielectric.

A significant aspect of this manufacturing method is thus to integrate the formation of the respective electrode devices and of the dielectric provided between them in the existing manufacturing process and to reduce the number of additional process steps by forming the respective electrode devices essentially directly underneath or directly above that material region which has the respective memory elements, in a manner such that at least part of the material region forms a part of the dielectric to be provided between the electrodes. This ensures that at least some of the process steps that are necessary to form the electrode devices and the dielectric can take place essentially simultaneously with the processing of the respective memory elements. This relates in particular to the formation of the dielectric because, for example, the material region has to be formed in any case as the region for receiving the memory elements, and therefore intermediate regions of the respective material region can consequently serve as a dielectric between adjacent memory elements or memory cells.

In a preferred embodiment of the method according to the invention, the memory elements are formed as magnetoresistive memory elements, in particular as TMR stack elements or the like. Additionally, the memory elements are constructed with multiple layers, in particular with a tunnel layer provided between a hard magnetic layer and a soft magnetic layer, and a barrier layer being formed in a delimiting fashion on the hard magnetic layer and/or on the soft magnetic layer, in particular facing away from the tunnel layer. By means of these measures, the formation of the necessary capacitor devices is integrated straight into the process sequence for a MRAM memory.

FIG. 1 illustrates a sectional side view of a structure of a first embodiment of the semiconductor memory device 1 in accordance with the invention.

The basic structure 10 of the embodiment in FIG. 1 is formed by an actual semiconductor substrate 11 in which, if appropriate, a corresponding CMOS structure is formed and embedded. This CMOS structure is covered by a first passivation region 12. First access line devices 13 are embedded and formed in this passivation region 12. Above these first metallization regions or first access line devices 13, in each case memory elements 20 are formed, which are constructed with multiple layers and have a first or lower barrier layer 21, a hard magnetic layer 22, a tunnel barrier layer 23, a soft magnetic layer 24, an upper barrier layer 25 and, if appropriate, a protective layer.

In each case, a second metallization layer 14 or second access line device 14 is provided adjacent to the upper barrier layer 25 or to the protective layer for the memory element 20. The first access line device 13 and the second access line device 14 can be formed, for example, by what are referred to as bit lines or word lines.

In the embodiment in FIG. 1, a first electrode device 43 of a capacitor device 40 is formed in the spatial vicinity of the respective first access line device 13, said capacitor device 40 being spatially separated and electrically insulated from the respective access line devices 13 by corresponding intermediate regions 18 and corresponding spacer elements 10f.

On the other hand, the second access line devices 14 are embedded in a second passivation region 50 in such a way that second intermediate regions 58 or corresponding spacer elements 50f are also provided between the second access line devices 40 and a second or upper electrode device 44 of the capacitor device 40 is provided for spacing them apart and electrically insulating them.

Figure 2:
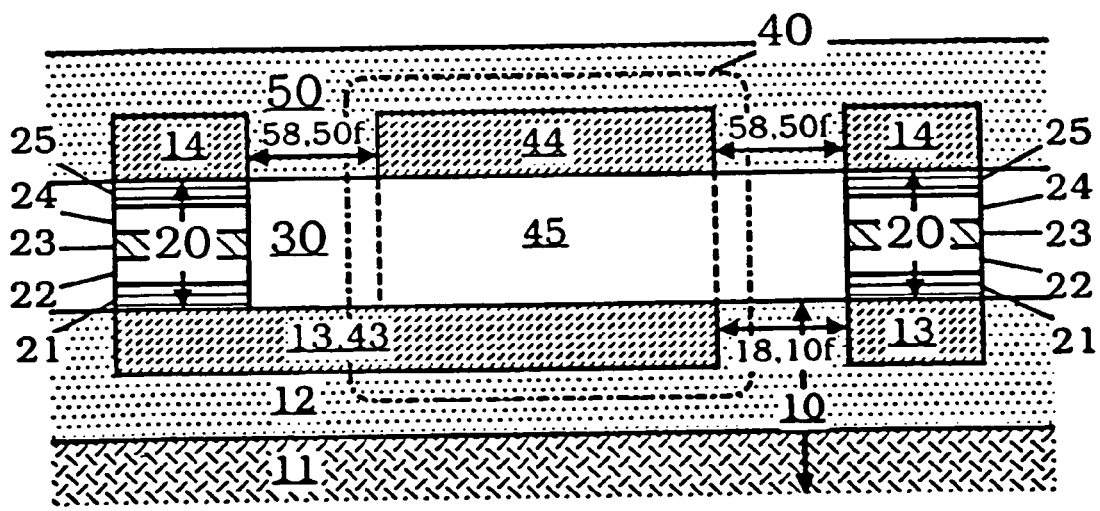

In the embodiment in FIG. 2, the first or lower access line device 13 is formed in a laterally widened fashion so that it simultaneously can perform the function of the first or lower electrode device 43 of the capacitor device 40.

Figure 3:
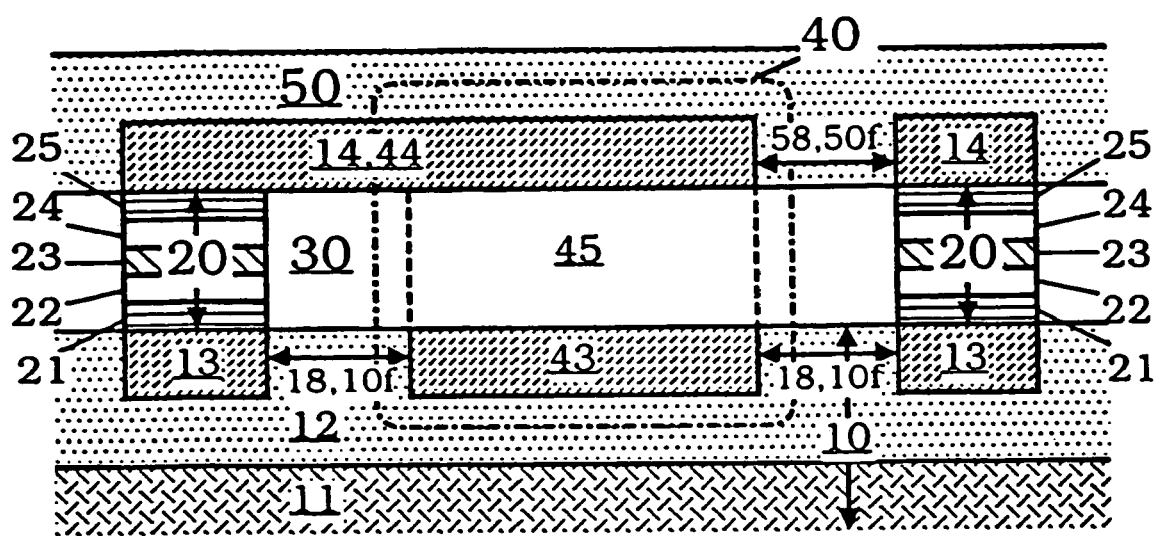

In the embodiment in FIG. 3, in contrast to the embodiment in FIG. 1, the second or upper access line device 14 is formed with a greater lateral extent so that it simultaneously or integrally forms the second or upper electrode device 44 of the electrode device 40.

In all three embodiments in FIGS. 1 to 3, the material region 30 for receiving the memory elements 20 also at least partially performs the function of providing the corresponding dielectric region 45 for the capacitor devices 40 between the first and second electrode devices 43 and 44, respectively.

For first making contact with the memory elements, it is advantageous that the memory elements are formed on a first metallization region, in particular on a first access line device and/or in particular with in each case its first barrier layer at the bottom. The first metallization region is essentially provided directly underneath the material region having the memory elements. This results in particular in the possibility of forming this first metallization region, and thus the first access line device, together with the first or lower electrode device of the capacitor device.

In another preferred embodiment of the method according to the invention for secondly making contact with the memory elements, a second metallization region is provided, in each case as a second access line device and/or essentially in contact with the respective memory element, with its respective second barrier layer. This measure ensures contact is made with the top of the memory cells and furthermore permits the simultaneous formation of the respective sound metallization layer or of the second access line device together with the second or upper electrode device of the capacitor device.

In another preferred embodiment of the method according to the invention, the first or lower electrode device and/or the second or upper electrode device is formed with the first metallization region and with the second metallization region, respectively, lying essentially in a plane and/or in a respective common material region.

The first or lower electrode device and/or the second or upper electrode device are formed spaced apart in an essentially lateral spatial direction with respect to the first metallization region or the second metallization region. As a result, in particular a spatial and/or a corresponding electrical isolation of the respective electrode devices from the metallization regions and from the access line devices is respectively achieved.

In addition, there may be provision that the first or lower electrode device and/or the second or upper electrode device are formed essentially electrically insulated from the first metallization region and the second metallization region, respectively, and that, for this purpose, in particular essentially electrically insulating spacer elements are provided in the intermediate region between the first or lower electrode device and the first metallization region and/or the second or upper electrode device and the second metallization region. This measure satisfies in particular the necessity for the respective electrode devices to be spatially spaced apart and/or electrically insulated from the metallization regions.

In another embodiment of the method according to the invention, either the first or lower electrode device or else the second or upper electrode device is formed in essentially electrical contact with the first metallization region and with the second metallization region, respectively, and that, for this purpose, in particular either the first or lower electrode device or the second or upper electrode device is formed in one part or one piece with the first metallization region or the second metallization region, respectively.

This measure simplifies the manufacturing process further because one of the electrode devices can be formed simultaneously together with the corresponding metallization region or the corresponding access line device. However, only one combination can be realized in all cases here because otherwise there would be a short-circuit of the two electrode devices, and therefore of the capacitor arrangement.

The following measures serve for the further integration of the process steps necessary for forming the capacitor device into the process sequence in order to form the actual semiconductor memory device.

For this purpose, there is provision in particular that the first or lower electrode device and the first metallization region and/or the second or upper electrode device and the second metallization region are each formed in an essentially common process step, in a common cascaded process sequence or the like.

It is particularly advantageous here that the first or lower electrode device and the first metallization region and/or the second or upper electrode device and the second metallization region are each formed by depositing and patterning corresponding metallization regions or the like, subsequently embedding in passivation regions and, if appropriate, subsequently planarizing or polishing to a level of a common surface region.

Here, the metallization regions are therefore formed first, from which on the one hand, the electrode devices and, on the other hand, the access line devices at a later stage are to be formed. Then, the respective metallization regions, which are possibly also provided separately, are embedded in a passivation region by specifically depositing a corresponding electrically insulating material so that it fills in the intermediate regions between the metallization regions. If appropriate, the overall structure must then be planarized to a common level or a common surface region using an appropriate polishing method.

On the other hand, a passivation region can also be formed first, in particular by means of an appropriate deposition method. Then, corresponding recesses can be formed in this deposited passivation region, specifically at the locations where the electrode devices are to be formed and the access line devices are to be formed. These recesses are then subsequently filled with a corresponding, essentially electrically conductive material, preferably with a metal.

In a semiconductor memory device, such as an MRAM memory device or the like, a multiplicity of memory elements are formed respectively spaced apart from one another laterally in a material region which extends essentially laterally and/or as a part thereof. Furthermore, at least one capacitor device is provided, with in each case at least a first or lower electrode device and a second or upper electrode device and a dielectric which is essentially formed between them. The semiconductor memory device according to the invention is further characterized in that the first or lower electrode device and/or the second or upper electrode device are formed essentially directly underneath or directly above the material region which has memory elements, and in that as a result—at least during operation—at least a part of the material region which has memory elements is provided at least as part of the respective dielectric.

An aspect of the present semiconductor memory device according to the invention is thus that the material region which is to be provided in any case to receive the individual memory elements is simultaneously also used as a dielectric between the electrode devices of the capacitor devices to be formed.

According to one preferred embodiment of the semiconductor memory device according to the invention, the memory elements are formed as magnetoresistive memory elements, in particular as TMR stack elements or the like. In addition the memory elements are constructed with multiple layers, in particular with a tunnel layer provided between a hard magnetic layer and a soft magnetic layer, a barrier layer being formed adjacent to the hard magnetic layer and/or to the soft magnetic layer, in particular facing away from the tunnel layer. These two measures implement in particular the application of the semiconductor memory device according to the invention in typical MRAM memories or the like.

For first making contact with the memory elements there is a provision that, according to a further embodiment of the semiconductor memory device according to the invention, the memory elements are formed on a first metallization region, in particular on a first access line device and/or in particular with in each case its first barrier layer at the bottom, the first metallization region being essentially provided directly underneath the material region having the memory elements.

In another embodiment of the semiconductor memory device according to the invention, for secondly making contact with the memory elements, a second metallization region is provided, in particular as a second respective access line device and/or in particular essentially in contact with the respective memory element, in particular with its respective second barrier layer.

The two last-mentioned measures ensure that, in the processes for forming a dielectric, the method steps for forming the first and second electrode devices of the capacitor device can also be carried out integrated with the processes for forming the first and second metallization regions, in particular the first and second access line devices.

According to another embodiment of the semiconductor memory device according to the invention there is provision that the first or lower electrode device and/or the second or upper electrode device are formed with the first metallization region and with the second metallization region, respectively, lying essentially in a plane and/or in a respective, common material region.

It is also advantageous that the first or lower electrode device and/or the second or upper electrode device are formed spaced apart in an essentially lateral spatial direction with respect to the first metallization region and the second metallization region, respectively. As a result, electrical insulation which is correspondingly necessary is easily brought about.

In addition, it is advantageous that the first or lower electrode device and/or the second or upper electrode device are formed essentially electrically insulated from the first material region and the second material region, respectively, and that, for this purpose, in particular essentially electrically insulating spacer elements are provided in the intermediate region between the first or lower electrode device and the first metallization region and/or the second or upper electrode device and the second metallization region.

Conversely, it is also possible that either the first or lower electrode device or the second or upper electrode device is formed in essentially electrically conductive contact with the first metallization region and with the second metallization region, respectively, and that, for this purpose, in particular either the first or lower electrode device or the second or upper electrode device is formed in one part or one piece with the first metallization region or with the second metallization region, respectively.

This and further aspects of the present invention result from the following observations. Magnetic memory cells (MRAMs) are a new type of electronic memory cells. The necessity for on-chip implementation of passive components such as capacitor devices or the like results from aspects of the functional reliability of the corresponding semiconductor memory devices. The present invention provides a way in which capacitive elements can be embedded in highly integrated (deep sub-micrometer) magnetic memory cells without additional process steps being necessary.

For example, corresponding capacitor structures can be arranged with an essentially vertical design in a corresponding memory cell array. Here, the sequence of lower electrode, dielectric and upper electrode extends in the vertical direction. On the one hand, a lower metallization plane M2, an upper metallization plane M3 and what is referred to as a TMR layer structure are provided with a corresponding embedding material region and, if appropriate, with a hard mask HM. This design provides the necessary lateral distance or spacing between the TMR elements or stacks and the respective lower or upper electrodes of the capacitor devices, and thus prevents the risk of short-circuits.

However, other variants are also possible, the second metal layer M2 being arranged underneath the TMR layer and insulated from it, in which the metal layer M2 is arranged not insulated underneath the TMR stack, in which the metal layer M3 is arranged insulated above the TMR stack and an arrangement in which the metal layer M3 is arranged not insulated above the TMR stack. Corresponding horizontal layouts are also conceivable.

In practice, any design or layout is possible as long as only the TMR stacks or TMR support regions do not make contact with both metal layers M2 and M3, specifically the lower and the upper electrode device of the capacitor devices.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is be defined only by the claims appended hereto, and by their equivalents.

The invention claimed is:

1. A method for manufacturing a semiconductor memory device, comprising:
    forming first and second metallization layers, a portion of said first and second metallization layers forming first and second access line devices;
    forming a plurality of memory elements, each of said memory elements located between and electrically connected to said first and second access line devices, and said memory elements respectively spaced apart from one another laterally in a material region, extending either substantially laterally or as a part thereof; and
    providing therein at least one capacitor device, comprising a first electrode device, a second electrode device, and a dielectric that is formed substantially between them,
    wherein at least one of the first electrode device and the second electrode device comprises another portion of said first and second metallization layer respectively; and
    whereby, at least a part of the material region in which the memory elements are formed is provided at least as part of the dielectric.

2. The method according to claim 1, wherein the memory elements are formed as magnetoresistive memory elements.

3. The method according to claim 1, wherein the memory elements are constructed of multiple layers, including a tunnel layer formed between a hard magnetic layer and a soft magnetic layer, and a barrier layer formed adjacent to at least one of the hard magnetic layer and the soft magnetic layer, and facing away from the tunnel layer.

4. The method according to claim 3, wherein, for first making contact with the memory elements, the memory elements are formed on said portion of said first metallization region comprising said first access line device, and with a first barrier layer at the bottom, the first metallization region is provided substantially underneath the material region having the memory elements.

5. The method according to claim 4, wherein said portion of said second metallization region forming said second access line device is provided for secondly making contact with the memory elements and is substantially in contact with the respective memory element with its respective second barrier layer.

6. The method according to claim 5, wherein at least one of the first electrode device and the second electrode device formed from the first metallization region and from the second metallization region, respectively, lying substantially in a plane or in a respective common material region.

7. The method according to claim 6, wherein at least one of the first electrode device and the second electrode device is formed spaced apart in an essentially lateral spatial direction with respect to the respective first access line device or the second access line device.

8. The method according to claim 7, wherein at least one of the first electrode device and the second electrode device is formed substantially electrically insulated from the first access line device and the second access line device, respectively, and electrically insulating spacer elements are provided in an intermediate region between the first electrode device and the first access line device and the second electrode device and the second access line device, respectively.

9. The method according to claim 8, wherein either the first electrode device or the second electrode device is formed in electrical contact with the first access line device and with the second access line device respectively, and either the first electrode device or the second or upper electrode device is formed as an extension of the first access line device or the second access line device, respectively.

10. The method according to claim 9, wherein at least the first electrode device and the first access line device or the second electrode device and the second access line device are each formed in an essentially common process step.

11. The method according to claim 9, wherein at least the first electrode device and the first access line device or the second electrode device and the second access line device are formed by depositing and patterning corresponding metallization regions, subsequently embedding in corresponding passivation regions and, subsequently planarizing to a level of a common surface region.

12. The according to claim 9, wherein at least the first electrode device and the first access line device or the second electrode device and the second access line device are each formed by depositing a passivation region, forming corresponding recesses and filling in the recesses with corresponding metallization regions.

13. A semiconductor memory device, comprising:
first and second access line devices formed in portions of first and second metallization layers respectively;
a plurality of memory elements each of said memory elements located between and electrically connected to both of said first and second access line device, and formed respectively spaced apart from one another laterally in a material region that extends substantially laterally or as a part thereof; and
at least one capacitor device comprising a first electrode device and a second electrode device and a dielectric that is between at least one of said first and second electrode devices formed in other portions of said first and second metallization layers respectively;
wherein at least one of the first or lower electrode device and the second electrode device is formed either substantially underneath or above the material region that contains the memory elements, and
whereby, at least a part of the material region that has the memory elements is provided at least as part of the dielectric.

14. The semiconductor memory device according to claim 13, wherein the memory elements are formed as magnetoresistive memory elements.

15. The semiconductor memory device according to claim 14, wherein the memory elements are constructed with multiple layers, including a tunnel layer provided between a hard magnetic layer and a soft magnetic layer, and a barrier layer is formed adjacent to the hard magnetic layer or the soft magnetic layer, facing away from the tunnel layer.

16. The semiconductor memory device according to claim 15, wherein, for first making contact with the memory elements, the memory elements are formed on said portion of said first metallization region, comprising said first access line device with a first barrier layer at the bottom, the first metallization region being provided substantially underneath the material region having the memory elements.

17. The semiconductor memory device according to claim 16, wherein for secondly making contact with the memory elements, said portion of said second metallization region comprising said second access line device, substantially in contact with the respective memory element and with a second barrier layer.

18. The semiconductor memory device according to claim 13, wherein at least one of the first or lower electrode device and the second electrode device is formed spaced apart in an essentially lateral spatial direction with respect to the first and the second access line device, respectively.

19. The semiconductor memory device according to claim 18, wherein at least one of the first electrode device and the second electrode device is formed electrically insulated from the first access line device and the second access line device, respectively, and electrically insulating spacer elements are provided in intermediate regions between the first or upper electrode device and the first access line device or the second or upper electrode device and the second access line device.

20. The semiconductor memory device according to claim 19, wherein at least one of the first electrode device or the second electrode device is in electrical contact with the first metallization region and with the second metallization region, respectively, and either the first or lower electrode device or the second electrode device is formed as part of the first access line device or the second access line device, respectively.

* * * * *

UNITED STATES PATENT AND TRADEMARK OFFICE
CERTIFICATE OF CORRECTION

PATENT NO. : 7,341,875 B2 Page 1 of 1
APPLICATION NO. : 10/478642
DATED : March 11, 2008
INVENTOR(S) : Nuetzel et al.

It is certified that error appears in the above-identified patent and that said Letters Patent is hereby corrected as shown below:

On the Title Page, Section (75) Inventors, 4th entry, delete "Wurn" and insert --Wurm--.
In Col. 8, line 62, after "The" insert --method--.
In Col. 10, line 7, after "elements," insert --the memory elements are formed on--.

Signed and Sealed this

Eighth Day of July, 2008

JON W. DUDAS
*Director of the United States Patent and Trademark Office*